US007738519B2

(12) United States Patent
Wong

(10) Patent No.: US 7,738,519 B2
(45) Date of Patent: Jun. 15, 2010

(54) LASER DRIVER AUTOMATIC POWER CONTROL CIRCUIT USING NON-LINEAR IMPEDANCE CIRCUIT

(75) Inventor: Thomas S. Wong, San Jose, CA (US)

(73) Assignee: Micrel, Inc., San Jose, CA (US)

( * ) Notice: Subject to any disclaimer, the term of this patent is extended or adjusted under 35 U.S.C. 154(b) by 83 days.

(21) Appl. No.: 11/775,763

(22) Filed: Jul. 10, 2007

(65) Prior Publication Data

US 2009/0016392 A1 Jan. 15, 2009

(51) Int. Cl.
*H01S 3/00* (2006.01)
(52) U.S. Cl. .................... 372/38.02; 372/38.1
(58) Field of Classification Search ............... 372/38.01
See application file for complete search history.

(56) References Cited

U.S. PATENT DOCUMENTS

| 3,980,969 | A | 9/1976 | Stengel |
| 4,037,163 | A | 7/1977 | Nicholas |
| 4,502,015 | A | 2/1985 | Nicholas et al. |
| 4,825,145 | A | 4/1989 | Tanaka et al. |
| 4,843,395 | A | 6/1989 | Morse |
| 5,029,129 | A | 7/1991 | Wai Wong |
| 5,254,851 | A | 10/1993 | Yamakawa et al. |
| 5,675,600 | A | * 10/1997 | Yamamoto et al. ....... 372/38.01 |
| 5,784,692 | A | 7/1998 | Kleinberg |
| 6,292,059 | B1 | 9/2001 | Ao et al. |
| 6,313,884 | B1 | 11/2001 | Van Endert |
| 6,895,226 | B1 | 5/2005 | Forster et al. |

OTHER PUBLICATIONS

"Laser Driver with Automatic Power Control," Micrel SY88952L Data Sheet, pp. 1-7.

* cited by examiner

*Primary Examiner*—Minsun Harvey
*Assistant Examiner*—Patrick Stafford
(74) *Attorney, Agent, or Firm*—Patent Law Group LLP; Carmen C. Cook

(57) ABSTRACT

A laser driver circuit includes a laser APC circuit receiving a monitor current indicative of the average optical output power of a laser diode and providing a bias adjust signal for adjusting a bias current for the laser diode. The laser APC circuit includes a first non-linear impedance circuit receiving the monitor current and generating a first voltage using a first non-linear current-to-voltage transfer function, a second non-linear impedance circuit receiving a reference current and generating a second voltage and being implemented using the same or a scaled version of the first non-linear current-to-voltage transfer function, and a comparator for comparing the first voltage with the second voltage and providing the bias adjust signal indicative of the difference between the first and second voltages. The first non-linear current-to-voltage transfer function has difference resistance portions for increasing the dynamic range of the current-to-voltage conversion.

13 Claims, 3 Drawing Sheets

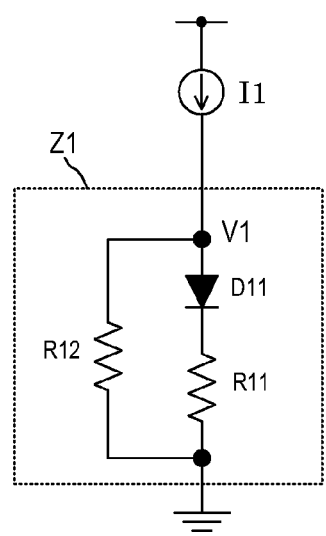
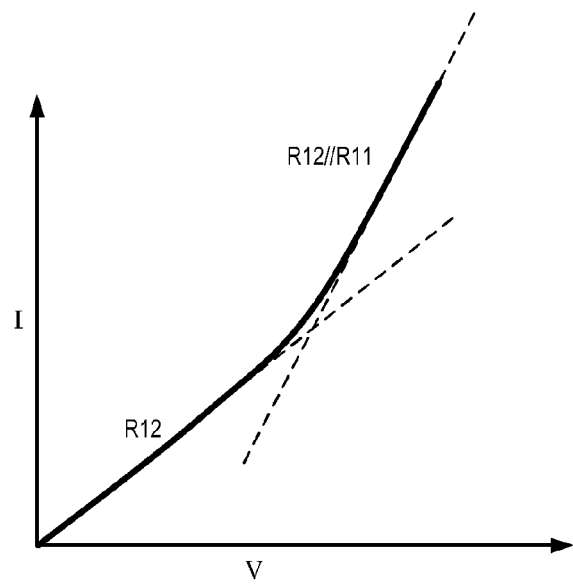
Fig. 2A    Fig. 2B
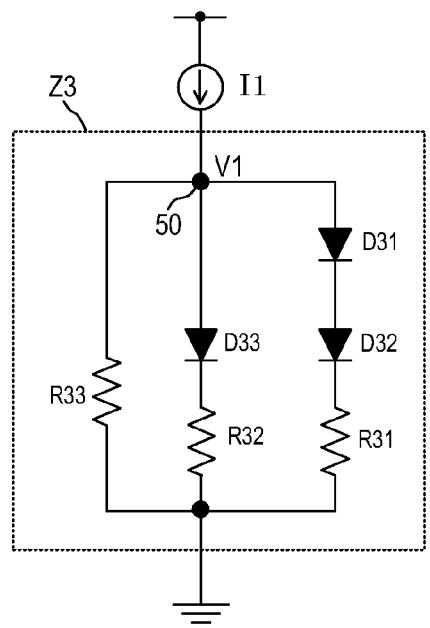
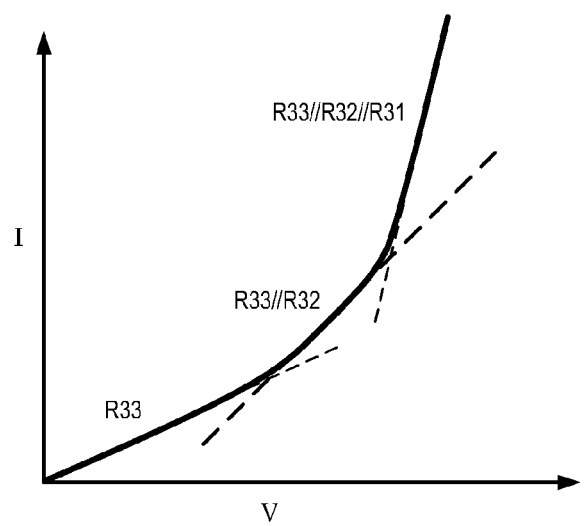
Fig. 3A    Fig. 3B

LASER DRIVER AUTOMATIC POWER CONTROL CIRCUIT USING NON-LINEAR IMPEDANCE CIRCUIT

FIELD OF THE INVENTION

The invention relates to laser driver automatic power control (APC) circuits and, in particular, to a laser driver APC circuit incorporating a non-linear impedance circuit for increasing the dynamic range for sensing the laser diode monitor current.

DESCRIPTION OF THE RELATED ART

Optical communication systems commonly employ semiconductor lasers or other optical emitters for transmitting signals indicative of a low value and a high value. The semiconductor laser or optical emitter may be formed as a fiber optics transmitter and an optical transceiver. Semiconductor lasers, such as edge emitting lasers and vertical cavity surface emitting lasers, are well known.

A semiconductor laser, also called a laser diode, requires a bias current above a threshold level applied to the laser to turn the laser on so that lasing can occur. Once the laser is turned on, that is, the bias current is above the threshold level, the laser can transmit data signals (high/low values) by receiving a data-dependent modulation current which operates to modify the optical power emitted by the laser diode. The two levels (high or low) of the data pattern are usually represented by a large emitted optical power or a small emitted optical power. A laser driver, typically implemented as an integrated circuit, is used to apply the desired bias current and the data-dependent modulation current.

The laser bias current must be adjusted over time to compensate for variations in the average output power level due to laser aging, temperature variations, and other factors. Once a specific bias current value is selected, it is often desirable that the laser bias current be maintained at a constant level and not drift from the selected value over time. In this manner, the laser output power level is also maintained at the desired level. An automatic power control (APC) circuit, a simple servo loop, is typically used to maintain the bias current at a constant value. In operation, the APC circuit receives a signal indicative of the laser diode output optical power and the APC circuit adjusts the bias current value in a manner to maintain the desired average output power level.

SUMMARY OF THE INVENTION

According to one embodiment of the present invention, a laser driver circuit includes a laser APC circuit receiving a monitor current indicative of the average optical output power of a laser diode and providing a bias adjust signal for adjusting a bias current for the laser diode. The laser APC circuit includes a first non-linear impedance circuit receiving the monitor current and generating a first voltage using a first non-linear current-to-voltage transfer function, a second non-linear impedance circuit receiving a reference current and generating a second voltage where the second non-linear impedance circuit is implemented using the first non-linear current-to-voltage transfer function or a scaled version of the first non-linear current-to-voltage transfer function, and a comparator for comparing the first voltage with the second voltage where the comparator provides the bias adjust signal indicative of the difference between the first voltage and the second voltage. The first non-linear current-to-voltage transfer function has a high resistance portion at a low current range and a low resistance portion at a high current range for increasing the dynamic range of the current-to-voltage conversion.

The present invention is better understood upon consideration of the detailed description below and the accompanying drawings.

BRIEF DESCRIPTION OF THE DRAWINGS

FIG. 2A illustrates a non-linear impedance circuit Z1 according to one embodiment of the present invention.

FIG. 2B illustrates the current-voltage characteristic of the non-linear impedance circuit Z1 of FIG. 2A.

FIG. 3A illustrates a non-linear impedance circuit Z3 according to an alternate embodiment of the present invention.

FIG. 3B illustrates the current-voltage characteristic of the non-linear impedance circuit Z3 of FIG. 3A.

DETAILED DESCRIPTION OF THE PREFERRED EMBODIMENTS

In accordance with the principles of the present invention, a laser driver APC circuit includes a first non-linear impedance circuit to receive the monitor current and a second non-linear impedance circuits to generate a reference voltage. The non-linear impedance circuit expands the dynamic range of the current-to-voltage conversion while preserving the desired resolution. In this manner, the laser driver APC circuit can handle a monitor current with a large current range.

In the automatic power control (APC) loop of a laser driver, the APC loop receives a signal indicative of the laser diode output optical power and the APC loop adjusts the bias current value in a manner to maintain the desired average output power level. In practice, the laser diode output optical power is measured using a laser monitoring photodiode ("the monitor diode"). The monitor diode generates an output current ("the monitor current") indicative of the laser output optical power. The output current of the monitor diode is provided to the APC loop for monitoring and adjusting the bias current thereof.

In most cases, the APC loop is implemented using a voltage comparator and the monitor current has to be converted to a voltage value. When converting a current value to a voltage value, there is often a trade-off between resolution and dynamic range. The monitor current can have a very large current range, such as from 1 µA to 1 mA. When converting the monitor current to a voltage value, a fine resolution at the low current range is required while a large dynamic range for the high current range is required.

For instance, a resistor is typically used to convert a current into a voltage. A resistor can provide resolution but not dynamic range. For example, if the current range to be measured (the dynamic range) is 1 µA to 1 mA and the desired resolution is 10 mV, then a 10 Kohm resistor has to be used to sense the current. But at the high end of the measurement range, a 1 mA current into a 10 Kohm resistor will produce 10V which is too high for most integrated circuits to handle. Thus, the 10 Kohm resistor can provide resolution but not dynamic range. In other cases, a diode may be used to convert a current value into a voltage value. A diode has a logarithmic current-voltage characteristic and therefore while it can provide dynamic range, it may not provide the necessary resolution.

Figure 1:
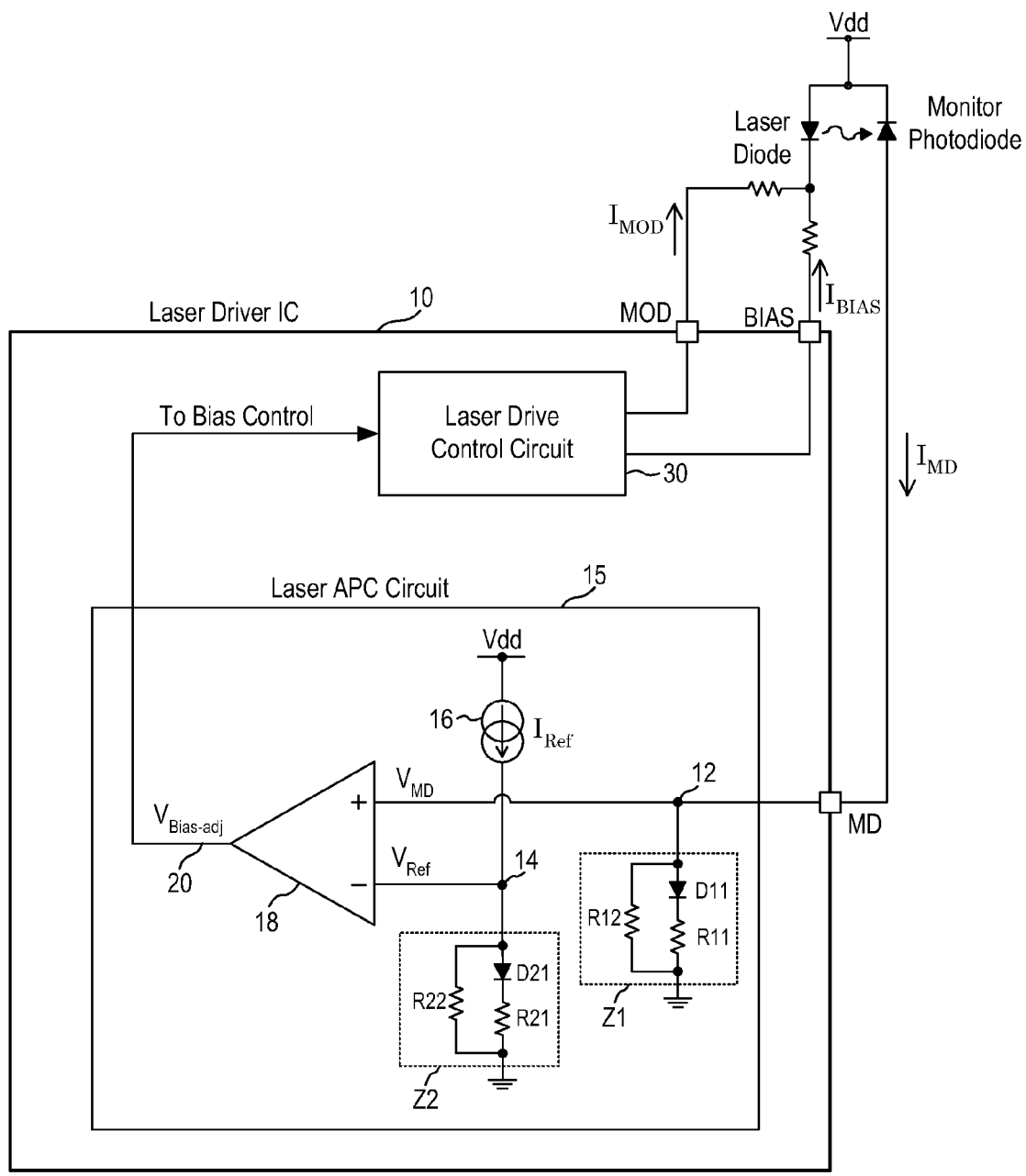
FIG. 1 is a schematic diagram of a laser driver integrated circuit coupled to drive a laser diode and incorporating a laser APC circuit according to one embodiment of the present invention.

In accordance with one embodiment of the present invention, a non-linear impedance circuit is provided in a laser driver APC loop to expand the dynamic range of the current measurement while preserving the conversion resolution. FIG. 1 is a schematic diagram of a laser driver integrated circuit coupled to drive a laser diode and incorporating a laser APC circuit according to one embodiment of the present invention. Referring to FIG. 1, a laser driver integrated circuit (IC) 10 is coupled to drive a laser diode for providing optical output signal. The optical output power of the laser diode is monitored by a monitor photodiode providing a monitor current $I_{MD}$ to the laser driver IC 10 indicative of the laser output optical power.

Laser Driver IC 10 includes a laser automatic power control (APC) circuit 15 and a laser drive control circuit 30. Laser APC circuit 15 receives the monitor current $I_{MD}$ from the monitor photodiode on a terminal MD and implements the automatic power control loop of the laser driver. Laser driver control circuit 30 receives the output signal from the laser APC circuit 15 and provides a bias current $I_{BIAS}$ on a terminal BIAS for biasing the laser diode. Laser driver control circuit 30 also generates a modulation current $I_{MOD}$ on a terminal MOD for modulating the laser diode in accordance with the desired data pattern. Laser driver IC 10 shown in FIG. 1 is illustrative only and is simplified to include only elements necessary to illustrate the practice of the present invention. In actual implementations, the laser driver IC may include other circuit components not shown in FIG. 1. For instance, the data signal and other control signal input to laser driver IC 10 are not shown in FIG. 1. Circuitries for implementing the data signal modulation and other control operation in a laser driver circuit are conventional.

Laser driver IC 10 implements an automatic power control (APC) loop where the APC loop receives a monitor current $I_{MD}$ from the monitor photodiode where the monitor current is the signal indicative of the laser diode output optical power. The APC loop adjusts the bias current value IBIAS provided to the laser diode to maintain the desired average output power level for the laser diode.

In laser APC circuit 15, the APC loop is implemented using a voltage comparator 18 comparing a voltage $V_{MD}$, indicative of the monitor current $I_{MD}$, to a reference voltage $V_{Ref}$. To generate the voltage $V_{MD}$, the monitor current $I_{MD}$ has to be converted to a voltage value. In accordance with the present invention, a first non-linear impedance circuit Z1 is used to convert the monitor current $I_{MD}$ to the voltage $V_{MD}$. To provide symmetry, the reference voltage is also generated from a reference current $I_{Ref}$ using a second non-linear impedance circuit Z2. Comparator 18 provides an output voltage $V_{Bias-adj}$ on an output node 20 indicative of the difference between the voltage $V_{MD}$ and voltage $V_{Ref}$. The output voltage $V_{Bias-adj}$ is provided to the bias control circuitry in laser drive control circuit 30 for adjusting the bias current $I_{BIAS}$ provided to the laser diode.

In the present description, a non-linear impedance circuit refers to a circuit that has a non-linear current-to-voltage transfer function. The non-linear impedance circuits Z1 and Z2 in laser APC circuit 15 operate to provide a non-linear current-to-voltage transfer function so that the dynamic range of the current-to-voltage conversion is increased without sacrificing the resolution of conversion. In the present embodiment, first non-linear impedance circuit Z1 includes a resistor R12 connected in parallel with the serial connection of a diode D11 and a resistor R11. More specifically, the anode terminal of diode D11 is connected to a node 12 being the MD terminal receiving the monitor current $I_{MD}$. Resistor R11 is connected between the cathode terminal of diode D11 and the ground potential. Resistor R12 is connected between node 12 and the ground potential. Second non-linear impedance circuit Z2 is constructed in the same manner as non-linear impedance circuit Z1. More specifically, the anode terminal of diode D21 is connected to a node 14 receiving the reference current $I_{Ref}$. Resistor R21 is connected between the cathode terminal of diode D21 and the ground potential. Resistor R22 is connected between node 14 and the ground potential.

For symmetry purpose, non-linear impedance circuits Z1 and Z2 are implemented using resistors having the same corresponding resistance values. That is, the resistance values of resistors R12 and R22 are the same while the resistance values of resistors R11 and R21 are the same. In this manner, non-linear impedance circuits Z1 and Z2 have the same current-voltage characteristics or the same current-to-voltage transfer function. In this manner, the reference voltage $V_{Ref}$ is generated using the same non-linear current-to-voltage transfer function as the monitor voltage $V_{MD}$.

In an alternate embodiment, non-linear impedance circuits Z1 and Z2 can have current-to-voltage transfer functions that are scaled versions of each other. That is, the resistance values of one of the non-linear impedance circuit can be scaled values of the other non-linear impedance circuit. For instance, resistor R22 can have a resistance value one-half of resistor R12 while resistor R21 has a resistance value one-half of resistor R11. It is understood that when resistors R21 and R22 are scaled down, the size of the associated diode D21 is scaled up accordingly to yield the desired scaling. As thus configured, non-linear impedance circuit Z2 has a non-linear current-to-voltage transfer function that is a scaled version of the non-linear current-to-voltage transfer function of circuit Z1. As long as the reference current $I_{Ref}$ is scaled accordingly, non-linear impedance circuit Z2 will generate the same reference voltage $V_{Ref}$ values as in the case when the same resistance values are used for both of the non-linear impedance circuits. That is, when circuit Z2 have scaled resistance values that are one half that of circuit Z1, reference current $I_{Ref}$ is doubled and diode D21 is doubled in size so that the same reference voltage values are generated.

In one embodiment, the current-voltage (I-V) characteristic of the first and second non-linear impedance circuits Z1 and Z2 is shown with reference to FIGS. 2A and 2B. FIG. 2A illustrates a non-linear impedance circuit Z1 that is identical in construction to the non-linear impedance circuits of FIG. 1. In FIG. 2A, the non-linear impedance circuit Z1 receives a representative current I1 to be converted to a voltage V1. At low current values, diode D11 is not turned on and thus only the current path of resistor R12 is activated. Thus, at low current values, the I-V characteristic of the non-linear impedance circuit Z1 is dominated by resistor R12 (see FIG. 2B). For larger current values, voltage V1 increases. When voltage V1 increases beyond the diode turn-on voltage of diode D11, diode D11 is turned on and current I1 now sees a resistance that is equivalent to the parallel combination of resistors R12 and R11 (R12//R11), resulting in a lower resistance.

When the non-linear impedance circuit Z1 of FIG. 2A including two current paths is used, the current-voltage (I-V) characteristic of FIG. 2B is obtained where the I-V characteristic of the non-linear impedance circuit Z1 has two segments each associated with the current path R12 or R12//R11. As a result, the resolution of the current-to-voltage conversion at low current values is maintained while the dynamic range of the current-to-voltage conversion at high current values is obtained by using a smaller resistance value. For instance, in one embodiment, the monitor current $I_{MD}$ has a current range of 50 μA to 1,500 μA. The non-linear impedance circuit Z1 enables accurate sensing of the large current range by providing different resistance for the current-to-voltage conversion at different current values over the entire current range of the monitor current $I_{MD}$.

In other embodiments, a non-linear impedance can be formed with multiple current paths, each activated by one or more diodes, to yield an I-V characteristic being piecewise linear. FIG. 3A illustrates a non-linear impedance circuit according to one embodiment of the present invention. Referring to FIG. 3A, non-linear impedance circuit Z3 includes three current paths. In the first current path, a resistor R33 is connected between a node 50 receiving the representative input current I1 and the ground potential. In the second current path, a diode D33 is connected in series with a resistor R32 between node 50 and the ground potential. In the third current path, diodes D31, D32 and a resistor R31 are connected in series between node 50 and the ground potential.

FIG. 3B illustrates the resultant I-V characteristic of non-linear impedance circuit Z3. As the current I1 increases and the voltage V1 at node 50 increases, the I-V characteristics of non-linear impedance circuit Z3 are modified accordingly by the resistances of resistors R33, R32 and R31. More specifically, at low current values, only the first current path is activated and the resistance of resistor R33 dominates. Then when voltage V1 increases beyond one diode voltage drop, diode D33 is turned on and the parallel resistance of resistors R32 and R33 (R33/R32) dominates. The third current path is not yet activated at this point. But when the voltage V1 increases beyond two diode voltage drops, diodes D31 and D32 are turned on and the I-V characteristic becomes the parallel resistance of resistors R31, R32 and R33. The I-V characteristic of non-linear impedance circuit Z3 thus has three segments defined by the separate current paths with each segments being activated by increasing voltage values in increments of the diode voltage drop.

The resistance values of the resistors in the non-linear impedance circuit are selected based on the range of current to be sensed. In general, a large resistance value is used for the low current values and a small resistance value is used for the large current values so that the dynamic range of current sensing can increase without decreasing the resolution.

Figure 4:
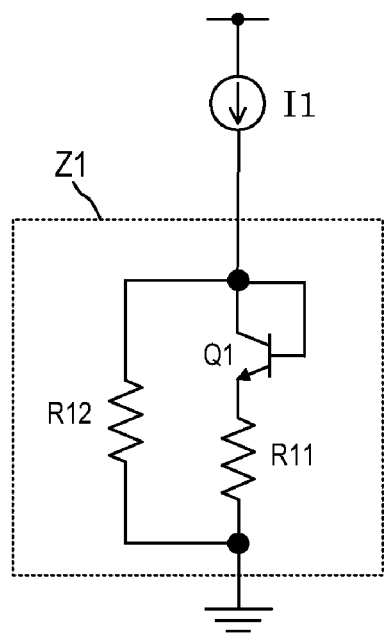
FIGS. 4 and 5 illustrate implementations of the non-linear impedance circuit of FIG. 2A using transistors according to different embodiments of the present invention.
Figure 5:
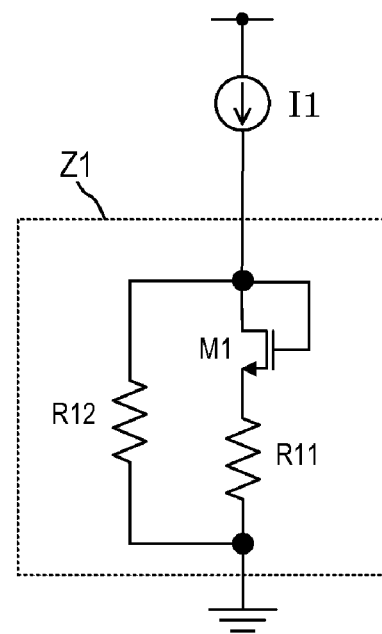

FIGS. 4 and 5 illustrate implementations of the non-linear impedance circuit of FIG. 2A using transistors according to different embodiments of the present invention. In FIG. 4, a diode-connected bipolar transistor Q1 is used to implement diode D11. More specifically, the base and collector terminals of the NPN bipolar transistor Q1 are shorted together to form the diode-connected bipolar transistor. In FIG. 5, a diode-connected MOS transistor M1 is used to implement diode D11. More specifically, the gate and drain terminals of the NMOS transistor M1 are shorted together to form the diode-connected MOS transistor. When scaling is applied to the non-linear impedance circuits of FIGS. 4 and 5, it is understood that when the resistance values of resistors R11 and R12 are scaled down, the size of the bipolar transistor Q1 or the MOS transistor M1 is scaled up accordingly.

The above detailed descriptions are provided to illustrate specific embodiments of the present invention and are not intended to be limiting. Numerous modifications and variations within the scope of the present invention are possible. The present invention is defined by the appended claims.

I claim:

1. A laser driver circuit including a laser APC circuit receiving a monitor current indicative of the average optical output power of a laser diode and providing a bias adjust signal for adjusting a bias current for the laser diode, the laser APC circuit comprising:

a first non-linear impedance circuit receiving the monitor current and generating a first voltage using a first non-linear current-to-voltage transfer function;

a second non-linear impedance circuit receiving a reference current and generating a second voltage, the second non-linear impedance circuit being implemented using the first non-linear current-to-voltage transfer function or a scaled version of the first non-linear current-to-voltage transfer function; and a comparator for comparing the first voltage with the second voltage, the comparator providing the bias adjust signal indicative of the difference between the first voltage and the second voltage, wherein the first non-linear current-to-voltage transfer function has a high resistance portion at a low current range and a low resistance portion at a high current range for increasing the dynamic range of the current-to-voltage conversion.

2. The laser driver circuit of claim 1, wherein each of the first and second non-linear impedance circuits comprises:

a first node for receiving the respective monitor current or the reference current;

a plurality of current paths connected in parallel between the first node and a ground node, a first current path being permanently activated and the remaining current paths being successively activated with increasing voltages at the first node, the combination of the activated current paths defining the resistance for each voltage region.

3. The laser driver circuit of claim 2, wherein each of the plurality of current paths include a resistive element, and the remaining current paths except the first current path each includes an increasing number of diodes, each of the remaining current paths being activated with increasing diode drop voltage.

4. The laser driver circuit of claim 1, wherein each of the first and second non-linear impedance circuits comprises:

a first node for receiving the respective monitor current or the reference current;

a first resistor connected between the first node and a ground node;

a diode having an anode terminal connected to the first node and a cathode terminal; and a second resistor connected between the cathode terminal of the diode and the ground node.

5. The laser driver circuit of claim 4, wherein the diode comprises a diode connected bipolar transistor.

6. The laser driver circuit of claim 4, wherein the diode comprises a diode connected MOS transistor.

7. The laser driver circuit of claim 4, wherein the second non-linear impedance circuit has a second non-linear current-to-voltage transfer function that is a scaled version of the first non-linear current-to-voltage transfer function, the second non-linear impedance circuit comprising first and second resistors having resistance values that are scaled from the resistance values of the first and second resistors of the first non-linear impedance circuit.

8. The laser driver circuit of claim 7, wherein the reference current provided to the second non-linear impedance circuit is scaled accordingly to generate the second voltage having the same voltage magnitude as the case where the second non-linear impedance circuit has the same current-to-voltage transfer function as the first non-linear impedance circuit.

9. The laser driver circuit of claim 1, wherein each of the first and second non-linear impedance circuits comprises:
- a first node for receiving the respective monitor current or the reference current;
- a first resistor connected between the first node and a ground node;
- a first diode having an anode terminal connected to the first node and a cathode terminal;
- a second resistor connected between the cathode terminal of the first diode and the ground node;
- a second diode having an anode terminal connected to the first node and a cathode terminal;
- a third diode having an anode terminal connected to the cathode terminal of the second diode and a cathode terminal; and
- a third resistor connected between the cathode terminal of the third diode and the ground node.

10. The laser driver circuit of claim 9, wherein each of the first, second and third diodes comprises a diode connected bipolar transistor.

11. The laser driver circuit of claim 9, wherein each of the first, second and third diodes comprises a diode connected MOS transistor.

12. The laser driver circuit of claim 9, wherein the second non-linear impedance circuit has a second non-linear current-to-voltage transfer function that is a scaled version of the first non-linear current-to-voltage transfer function, the second non-linear impedance circuit comprising first, second and third resistors having resistance values that are scaled from the resistance values of the first, second and third resistors of the first non-linear impedance circuit.

13. The laser driver circuit of claim 12, wherein the reference current provided to the second non-linear impedance circuit is scaled accordingly to generate the second voltage having the same voltage magnitude as the case where the second non-linear impedance circuit has the same current-to-voltage transfer function as the first non-linear impedance circuit.

* * * * *